United States Patent [19]
Ishida et al.

[11] Patent Number: 5,541,788
[45] Date of Patent: Jul. 30, 1996

[54] MAGNETIC DISK DRIVE AND FLEXIBLE PRINTED CIRCUIT BOARD

[75] Inventors: Katsuaki Ishida; Yoshiaki Nagasawa; Masaharu Sugimoto; Tomoo Sukagawa, all of Kawasaki, Japan

[73] Assignee: Fujitsu Limited, Japan

[21] Appl. No.: 346,368

[22] Filed: Nov. 29, 1994

Related U.S. Application Data

[63] Continuation of Ser. No. 95,448, Jul. 20, 1993, abandoned.

[30] Foreign Application Priority Data

Jul. 20, 1992 [JP] Japan .................................. 4-192134
Aug. 17, 1992 [JP] Japan .................................. 4-217637

[51] Int. Cl.⁶ .............................. G11B 5/55; H05K 1/11
[52] U.S. Cl. ..................... 360/98.01; 361/749; 439/67
[58] Field of Search ........................ 360/98.01, 98.05, 360/104, 97.01, 97.02, 97.03; 439/67; 361/736, 748–749, 752–753, 755–756

[56] References Cited

U.S. PATENT DOCUMENTS

| | | | |
|---|---|---|---|
| 4,432,027 | 2/1984 | Higuchi ................................... | 360/104 |
| 4,823,217 | 4/1989 | Kato et al. ............................... | 360/104 |
| 5,025,335 | 6/1991 | Stefansky .............................. | 360/97.01 |
| 5,055,969 | 10/1991 | Putnam .................................. | 360/104 |
| 5,095,396 | 3/1992 | Putnam et al. ........................ | 360/97.01 |
| 5,103,359 | 4/1992 | Marazzo ................................. | 360/104 |
| 5,198,948 | 3/1993 | Stover et al. ........................... | 360/124 |
| 5,202,804 | 4/1993 | Takekado ............................... | 360/104 |
| 5,392,175 | 2/1995 | Beecroft ............................... | 360/97.01 |

FOREIGN PATENT DOCUMENTS

| | | | |
|---|---|---|---|
| 90421 | 7/1981 | Japan ..................................... | 360/104 |
| 57-143717 | 9/1982 | Japan . | |
| 63-53710 | 3/1988 | Japan . | |
| 63-55717 | 3/1988 | Japan . | |
| 1-78313 | 5/1989 | Japan . | |
| 1212488 | 8/1989 | Japan ..................................... | 439/67 |
| 1225191 | 9/1989 | Japan ..................................... | 439/67 |
| 1-292619 | 11/1989 | Japan . | |
| 2-64972 | 3/1990 | Japan . | |
| 2-177075 | 7/1990 | Japan . | |
| 2-177013 | 7/1990 | Japan . | |
| 3-94617 | 9/1991 | Japan . | |
| 3-290801 | 12/1991 | Japan . | |
| 4-69803 | 3/1992 | Japan . | |

*Primary Examiner*—Stuart S. Levy
*Assistant Examiner*—George J. Letscher
*Attorney, Agent, or Firm*—Greer, Burns & Crain, Ltd.

[57] ABSTRACT

A magnetic disk device includes a flexible printed circuit board having a first portion provided with read/write ICs for read/write heads and first printed patterns connected to the read/write ICs and a second portion positioned within the first portion, an end of the second portion being connected to the first portion so as to be bendably projected from the first portion, the second portion being provided with a servo IC for the servo head and second printed patterns connected to the servo IC, the flexible printed circuit board being mounted on an actuator body such that one end of the first portion lies outside the actuator and the second portion lies on the actuator body. The magnetic disk device also includes first lead wires of the read/write heads extending to the flexible printed circuit board and being connected to the first patterns, and second lead wires of the servo head extending to the flexible printed circuit board and being connected to the second printed patterns. The first lead wires and the read/write ICs are on one side of an imaginary plane while the second wires and the servo IC are on an opposite side of the imaginary plane, the imaginary plane passing through the tip end of an arm structure and a shaft of the actuator body and being parallel to the shaft.

19 Claims, 20 Drawing Sheets

MAGNETIC DISK DRIVE AND FLEXIBLE PRINTED CIRCUIT BOARD

RELATED APPLICATIONS

This is a continuation of application Ser. No. 08/095,448, filed on Jul. 20, 1993, now abandoned.

BACKGROUND OF THE INVENTION (1) Field of the invention

The present invention relates to a magnetic disk device having read/write heads and a servo head both of which are supported by an actuator so as to face surfaces of magnetic disks. The present invention further relates to a flexible printed circuit board on which circuits to be coupled to the read/write heads and the servo head are formed.

(2) Description of the related art

Recently, in computer systems, processing speed and storage capacity have been increased. There is also trend for down sizing thereof. A magnetic disk unit used as an external storage unit of the computer system has been miniaturized, requiring that various components be arranged with a high density in the magnetic disk unit.

In a magnetic disk unit, the actuator drives arms on which magnetic heads are mounted. There are two types of magnetic heads. A first type is referred to as a read/write head used for reading information from and writing information on a magnetic disk. A second type is referred to as a servo head used for reading servo information from a servo surface of a magnetic disk. The actuator is controlled based on the servo information so that the read/write head is positioned on a track of the magnetic disk.

To miniaturize the magnetic disk unit, the actuator must be miniaturized. Due to miniaturization of the actuator, lead wires of the read/write head are close to lead wires of the servo head. An alternating current having a high level flows through the lead wires of the read/write head. Thus, under a condition in which the lead wires of the read/write head are close to the lead wires of the servo head, electro-magnetic waves are generated by the alternating current flowing through the lead wires of the read/write head and noises are thus induced in the lead wires of the servo head by the electro-magnetic waves. The noises induced in the lead wires of the servo head may prevent the servo head from precisely reading out the servo information from the magnetic disk. Thus, it is preferable that the lead wires of the read/write head and the lead wires of the servo head be provided far from each other.

In addition, the read/write head and the servo head are respectively electrically connected to a driving IC and a servo IC. In a read/write operation, large amount of electric current is supplied to the driving IC. Thus, if the driving IC and the servo IC are arranged so as to be close to each other, the electric current supplied to the driving IC affects the servo IC. That is, induced noises occur in the driving IC.

To relieve the above problems, the following circuit arrangement provided between magnetic heads (including read/write heads and a servo head) and ICs has been proposed.

FIG. 1 and FIG. 2 show an actuator for moving a plurality of read/write heads and a servo head. Referring to FIG. 1 and FIG. 2, a plurality of magnetic disks 2 are rotatably supported so as to be provided in layers. The magnetic disks are rotated by a spindle motor (not shown) at a predetermined speed (e.g. 3600 rpm). The enclosure 1 is provided with a magnetic circuit 3 at a corner thereof. The magnetic circuit 3 has a mounting portion 4 to be mounted on the enclosure 1, an inner yoke 5 provided adjacent to the mounting portion 4, and an outer yoke 6 also provided adjacent to the inner yoke 5. A surface of the outer yoke 6 facing the inner yoke 5 is provided with magnets 7 and 8. A surface of the inner yoke 5 facing the outer yoke 6 is provided with magnets 9 and 10. A magnetic gap 11 is formed between a set of magnets 7 and 8 mounted on the inner yoke 5 and a set of magnets 9 and 10 mounted on the outer yoke 6.

An actuator body 15 is rotatably supported by an actuator shaft 12. First and second ends of the actuator shaft 12 are fixed on the mounting portion 4 by screws 13 and 14. The actuator body 15 is provided with a plurality of head arms 16 that extend from a surface thereof toward the magnetic disks 2. The respective head arms 16 are connected to spring arms 17 on which magnetic heads 18 are mounted at ends thereof. The magnetic heads 18 include a servo head for reading out servo information from a surface (referred to as a servo surface) of a predetermined magnetic disk 2' among the plurality of magnetic disks 2 and a plurality of read/write heads for reading out data from and writing data on the surfaces (referred to as data surfaces) of the magnetic disks 2. The magnetic disk 2' having the servo surface is positioned at approximately a middle portion of all the magnetic disks 2. In a case where tracking control of all the magnetic heads 18 with respect to the magnetic disks 2 is performed based on the servo information read out from the magnetic disk 2' positioned at the middle portion of all the magnetic disks 2, the amount of off-tracking of each of the magnetic heads 18 caused by the temperature variation is very small. This tracking servo method is often referred to as a center servo method.

A coil 19 is mounted on the surface of the actuator body 15 so as to be opposite to the head arms 16. The coil 19 is positioned in the magnetic gap 11. When an electric current is supplied from a controller (not shown) to the coil 19, a driving force is generated by an interaction between a magnetic field generated by the coil 19 and a magnetic field in the magnetic gap 11. The actuator body 15 is pivoted on the actuator shaft 12 by the driving force. The amount of pivoting of the actuator body 15 is controlled in accordance with the servo information read out from the servo head, so that the respective magnetic heads 18 are positioned on required tracks of the magnetic disks 2.

A circuit arrangement between the magnetic heads 18 and electric components (e.g. a driving IC and a servo IC) is formed as follows.

A flexible printed circuit board (hereinafter referred to as a FPC board) 32 is used for forming the circuit connecting the magnetic heads 18 to the driving ICs. The FPC board 32 is formed as shown in FIG. 3. Referring to FIG. 1–FIG. 3, the FPC board 32 extends sideways in the long direction, and has an engaging portion 34, a movable portion 35, a bending portion 36 and a projecting portion 37. The engaging portion 34 is fixed on a bracket 31 by screws 33, bracket 31 being mounted on the base plate 1a so as to extend from the mounting portion 4 of the magnetic circuit 3 toward the magnetic disks 2. The movable portion 35 is mounted on the side surface of the actuator body 15. The bending portion 36 bends in accordance with the pivoting operation of the actuator body 15 between the side surface of the actuator body 15 and the bracket 31. The projecting portion 37 extends either over or under the head arms 16 to a side surface of the actuator body 15 opposite to the side surface on which the movable portion 35 is mounted. The movable portion 35 is provided with a read/write head land 38 having pads to which lead wires of the read/write heads are to be connected. A servo head land 39 having pads to which lead wires are to be connected and an IC mounting land 40 are formed on an leading end area of the projecting portion 37. Printed lines are formed between the pads of the servo head land 39 and the IC mounting land 40. The servo IC are mounted on the IC mounting land 40 of the projecting portion 37. The engaging portion 34 is provided with an IC mounting land 41. Printed lines are formed between the pads of the read/write head land 38 and the IC mounting land 41. Driving ICs are mounted on the IC mounting land 41 of the movable portion 35. A connecting portion 42 is formed at an end of the FPC board 32 opposite to the movable portion 35 and the projecting portion 37. Pads are formed on the connecting portion 42, and printed lines extending from the IC mounting land 40 of the projecting portion 37 and from the IC mounting land 41 of the engaging portion 34 are connected to the pads of the connecting portion 42. Lead wires from a controller (not shown) are connected to the pads of the connecting portion 42.

In the above circuit arrangement, the engaging portion 34 of the FPC board 32 is fixed on the bracket 31 and the projecting portion 37 of the FPC board 32 extends either over or under the magnetic arms 16 to the side surface of the actuator body 15 opposite to the side surface facing the brackets 31. Thus, the driving ICs for the read/write heads and the servo IC for the servo head are separated far from each other.

In addition, the lead wires of each of the read/write heads extend along a side of a corresponding one of the head arm assemblies (including the head arms 16 and the spring arm 17) to the read/write head land 38 of the FPC board 32, lead wires of the servo head extend along a side of a head arm assembly opposite to the side along which the lead wires of the read/write head extend to the servo head land 39 of the FPC board 32. That is, the lead wires of the read/write heads and the servo head are separated by the head arm assemblies.

According to the above circuit arrangement between the magnetic heads and the ICs, the ICs are provided far from each other and the lead wires of the read/write heads and the lead wires of the servo head are separately extend along both sides of the head arm assemblies. Thus, the noises induced in the lead wires of the servo head can be decreased, and the electric current supplied to the driving ICs for the read/write heads is prevented from adversely affecting the servo IC for the servo head.

However, as the projecting portion 37 of the FPC board 32 must extend either over or under the head arms 16 to the side surface of the actuator body 15 opposite to the side surface on which the movable position 35 of the FPC board 32 is to be mounted, it is difficult to mount the FPC board 32 on the actuator. In addition, in order to separately position the lead wires of the lead/write heads and the servo head at the both sides of the head arm assemblies, the projecting portion 37 having the servo land 39 to be connected to the servo head must be projected from the movable portion 35 having the read/write head land 38 to be connected to the read/write head. Thus, a plurality of FPC boards can not be effectively cut out from a sheet-shaped material. As a result, the production cost of the FPC board 32 is increased.

SUMMARY OF THE INVENTION

Accordingly, a general object of the present invention is to provide a novel and useful in a magnetic disk device and a flexible printed circuit board applicable to the magnetic disk device, in which the disadvantages of the aforementioned prior art are eliminated.

A more specific object of the present invention is to provide a magnetic disk device by which an electric current flowing in lead wires of read/write heads does not adversely affect the servo signal in the lead wires of the servo head.

Another object of the present invention is to provide a magnetic disk device capable of being easily formed using a simply shaped flexible printed circuit board.

The above object of the present invention are achieved by the following magnetic disk device. The magnetic disk unit has a plurality of magnetic disks, a plurality of read/write heads for reading out and writing information from and in the plurality of magnetic disks, a servo head for reading out servo information from a surface of a predetermined magnetic disk among the plurality of magnetic disks and an actuator for moving the plurality of read/write heads and the servo head under a condition in which the plurality of read/write heads and the servo head face surfaces of the plurality of magnetic disks. The actuator in the above magnetic disk unit has an actuator body rotatably supported by a shaft and an arm structure extending from the actuator body toward the plurality of magnetic disks. The plurality of read/write heads and the servo head are mounted at a tip end of the associated arm structure. The above magnetic disk device also includes a flexible printed circuit board having a first portion and a second portion. The first portion is provided with a first circuit element for the plurality of read/write heads and with first printed patterns connected to the first circuit element. The second portion is positioned within the first portion, an end of thereof being connected to the first portion so as to be bendably projected from the first portion, and is provided with a second circuit element for the servo head and with second printed patterns connected to the second circuit element, the flexible printed circuit board being mounted on the actuator body such that one end of the first portion lies outside the actuator and the second portion lies on the actuator body. The magnetic disk device further includes first lead wires of the read/write heads extending to the flexible printed circuit board and being connected to the first patterns; and second lead wires of the servo head extending to the flexible printed circuit board and being connected to the second printed patterns, wherein the first lead wires and the first circuit element for the plurality of read/write heads are on one side of an imaginary plane while the second wires and the second circuit element for the servo head are on an opposite side of the imaginary plane, the imaginary plane passing through the tip end of the arm structure and the shaft of the actuator body and being parallel to the shaft.

Another object of the present invention is to provide a flexible printed circuit board applicable to the above magnetic disk device.

The above objects of the present invention is achieved by the following flexible circuit board applicable to a magnetic disk device. The magnetic disk unit has a plurality of magnetic disks, a plurality of read/write heads for reading out and writing information from and in the plurality of magnetic disks, and a servo head for reading out servo information from a surface of a predetermined magnetic disk among the plurality of magnetic disks. The flexible printed circuit board includes a first portion provided with a first circuit element for the plurality of read/write heads and with first printed patterns connected to the first circuit element. It also has a second portion positioned within the first portion. An end of the second portion is connected to the first portion so as to be bendably projected from the first portion. The second portion is provided with a second circuit element for the servo head and with second printed patterns connected to the second circuit element, wherein first lead wires of the read/write heads may be connected to the first patterns, and second lead wires of the servo head may be connected to the second printed patterns.

According to the present invention, the first lead wires and the first circuit element for the plurality of read/write heads are on one side of an imaginary plane while the second wires and the second circuit element for the servo head are on an opposite side of the imaginary plane, said imaginary plane passing through the tip end of the arm structure and the shaft of the actuator body and being parallel to the shaft. Thus, an electric current flowing in the first lead wires of read/write heads does not affect the servo signal in the second lead wires of the servo head. In addition, the flexible printed circuit board is mounted on the actuator body such that one end of the first portion lies outside the actuator and the second portion lies on the actuator body. Thus, the circuit arrangement in the magnetic disk can be easily formed using a simply shaped flexible printed circuit board.

Additional objects, features and advantages of the present invention will become apparent from the following detailed description when read in conjunction with the accompanying drawings.

DESCRIPTION OF THE PREFERRED EMBODIMENTS

A description will now be given of a first embodiment of the present invention.

Figure 1:
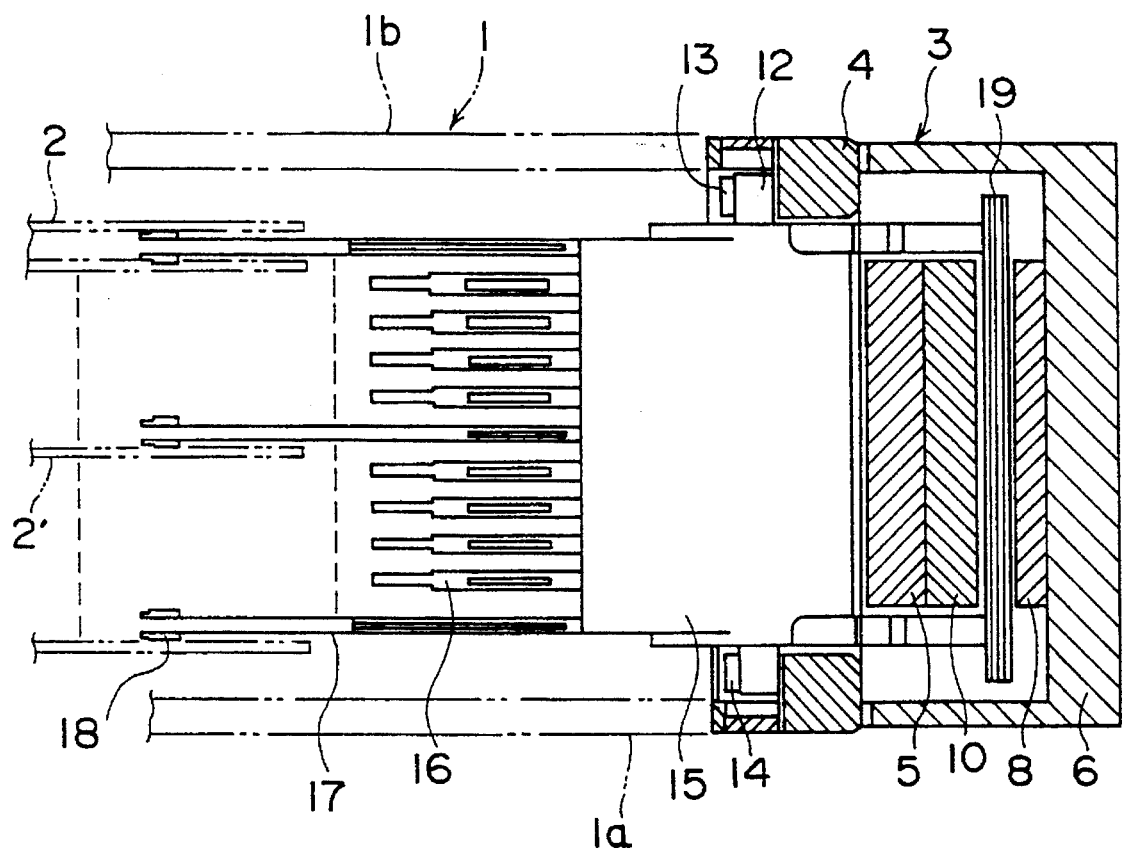
FIG. 1 is a partially sectional view illustrating an actuator to which a conventional circuit arrangement in a magnetic disk unit is applied.
Figure 2:
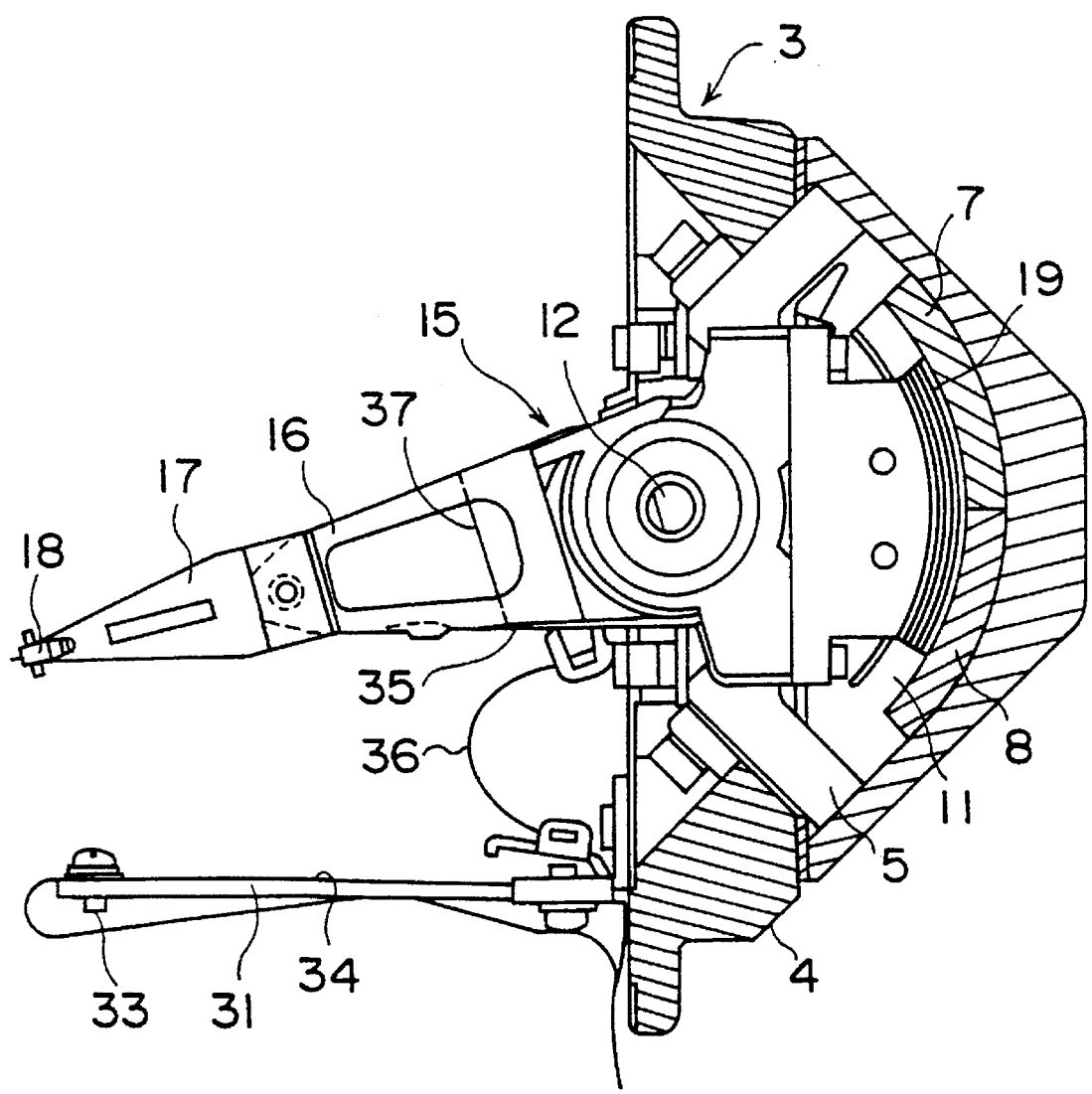
FIG. 2 is a plan view illustrating a conventional FPC board mounted between the actuator and a bracket.
Figure 3:
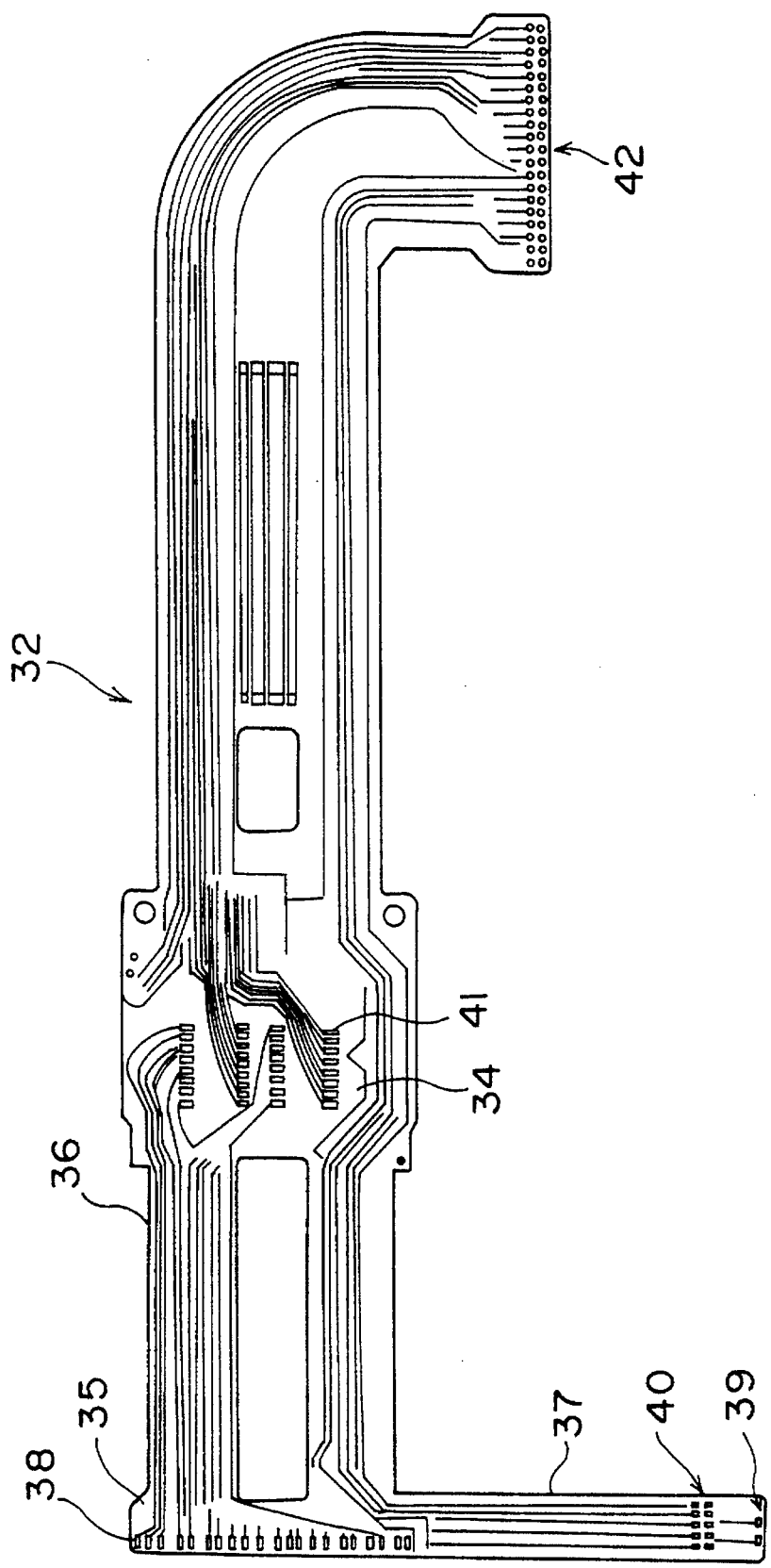
FIG. 3 is a plan view illustrating a structure of the conventional FPC board.
Figure 4:
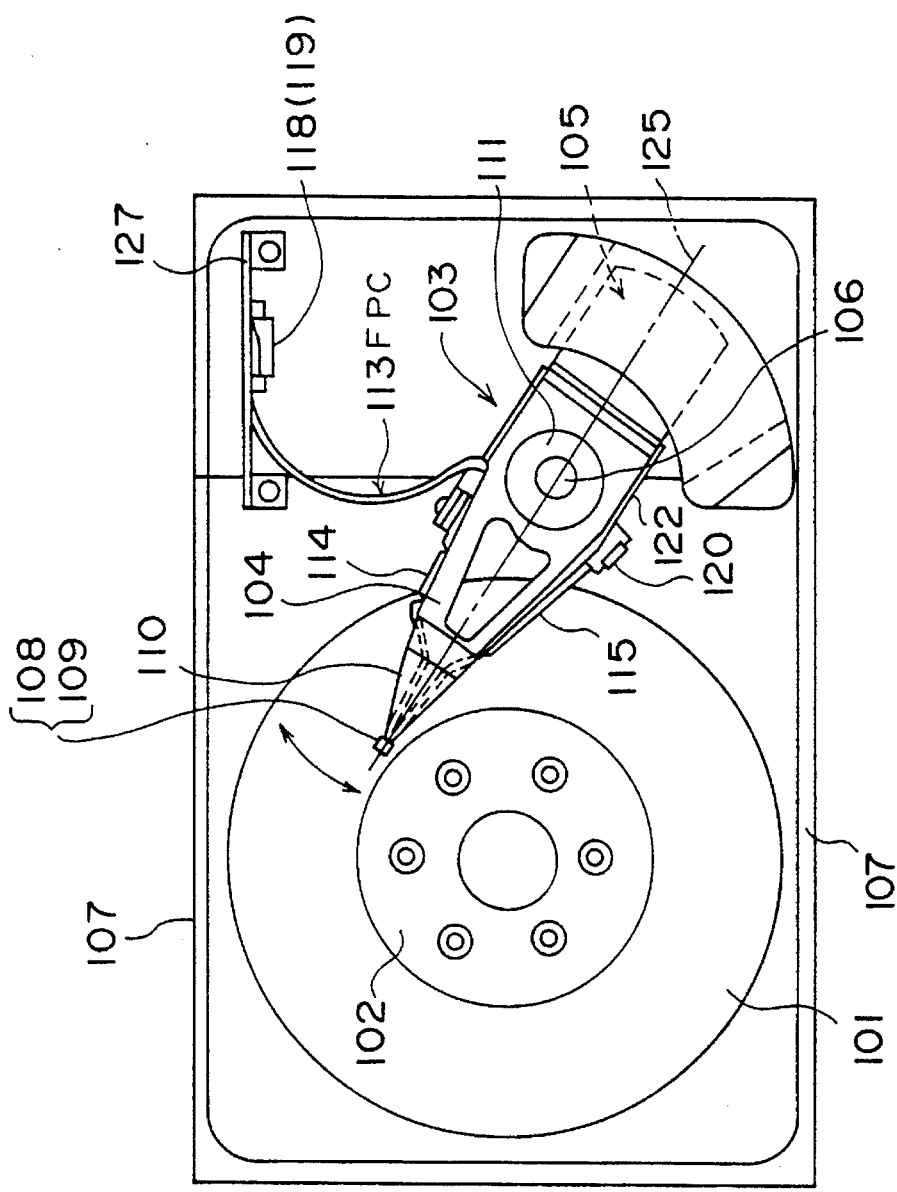
FIG. 4 is an inside view illustrating a magnetic disk unit provided with an actuator according to a first embodiment of the present invention.

A magnetic disk unit is formed as shown in FIG. 4. Referring to FIG. 4, a plurality of magnetic disks 101 are mounted on a spindle motor 102 provided on a base 107 so as to be layered. Due to rotation of the spindle motor 102, the magnetic disks 101 are concentrically rotated by the spindle motor 102 at a high speed. An actuator 103 is positioned close to the magnetic disks 101. The actuator 103 includes a head arm assemblies 104, a voice coil motor (VCM) 105, and an actuator body 111. The head arm assemblies 104 are provided with read/write heads 108 for reading out data from and writing data on the magnetic disks 101 and one of the head arm assemblies 104 is provided with a servo head 109 for reading out servo information from a servo surface of a predetermined magnetic disk among the plurality of magnetic disks 101. A flexible printed circuit board (a FPC board) 113 is fixed on the actuator 103 and a bracket 127 so as to be bent in a space between a bracket 127 and the actuator 103.

Figure 5:
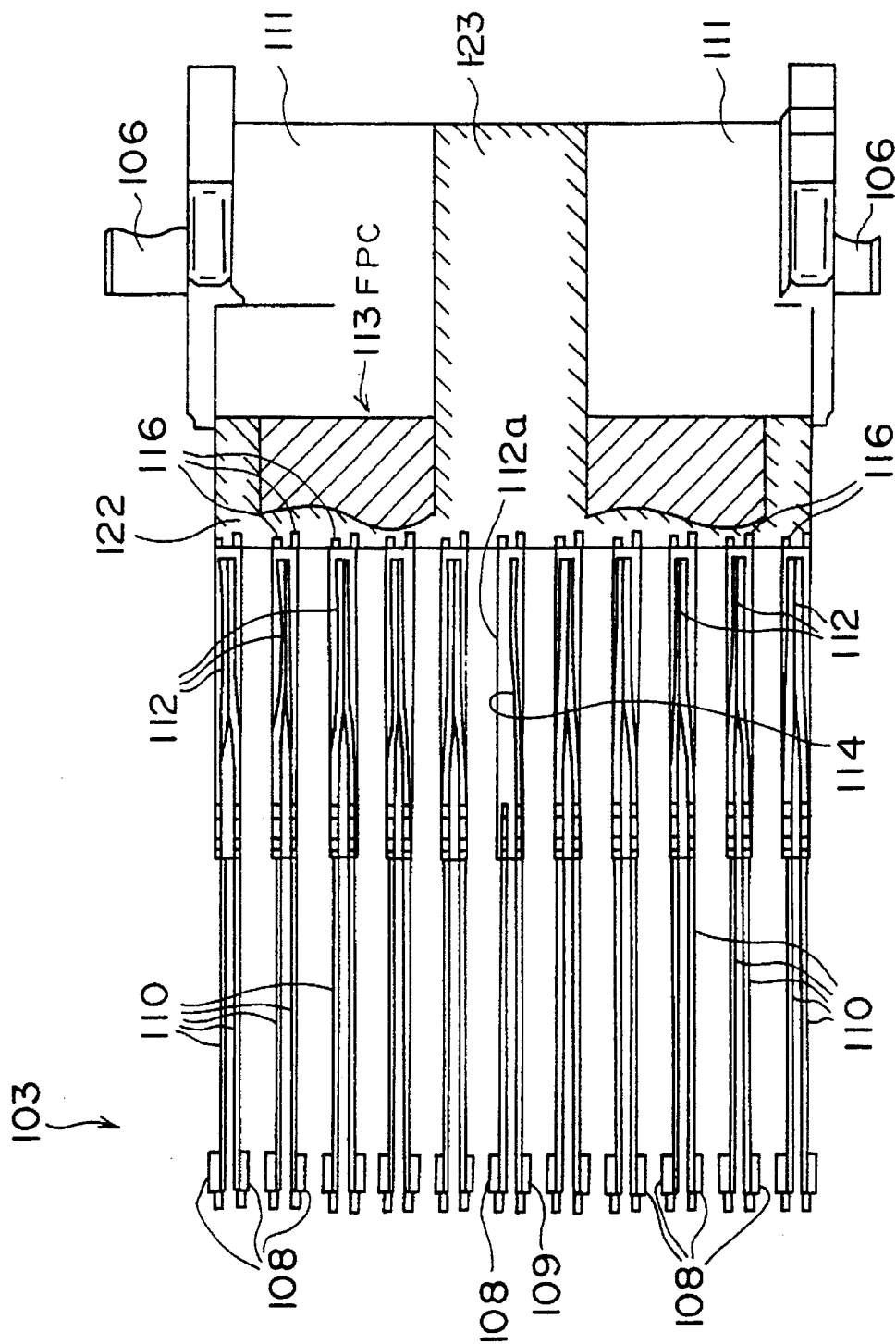
FIG. 5 is a side view illustrating the actuator.
Figure 6:
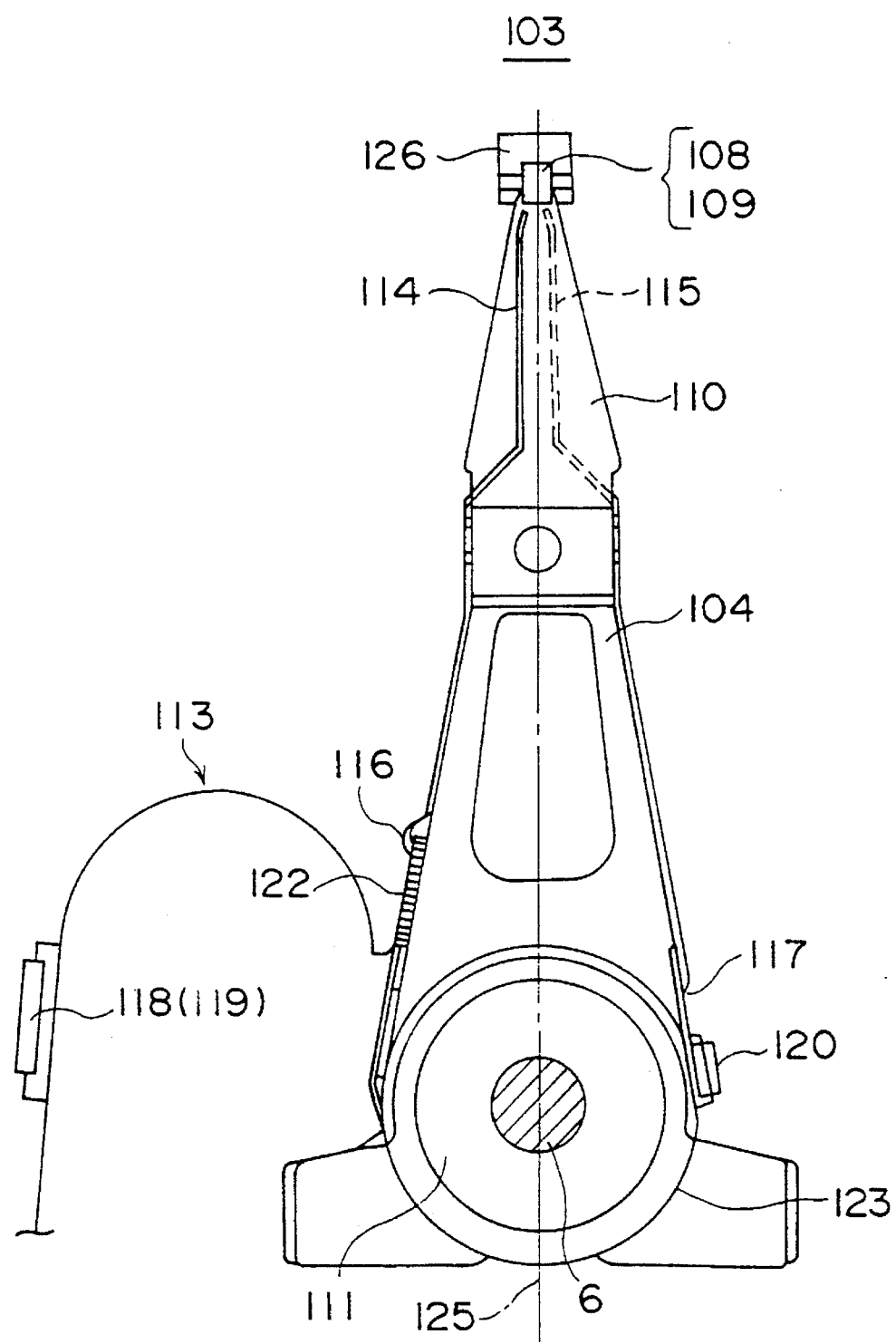
FIG. 6 is a plan view illustrating the actuator.

The actuator 103 is formed as shown in FIGS. 5 and 6.

Figure 7:
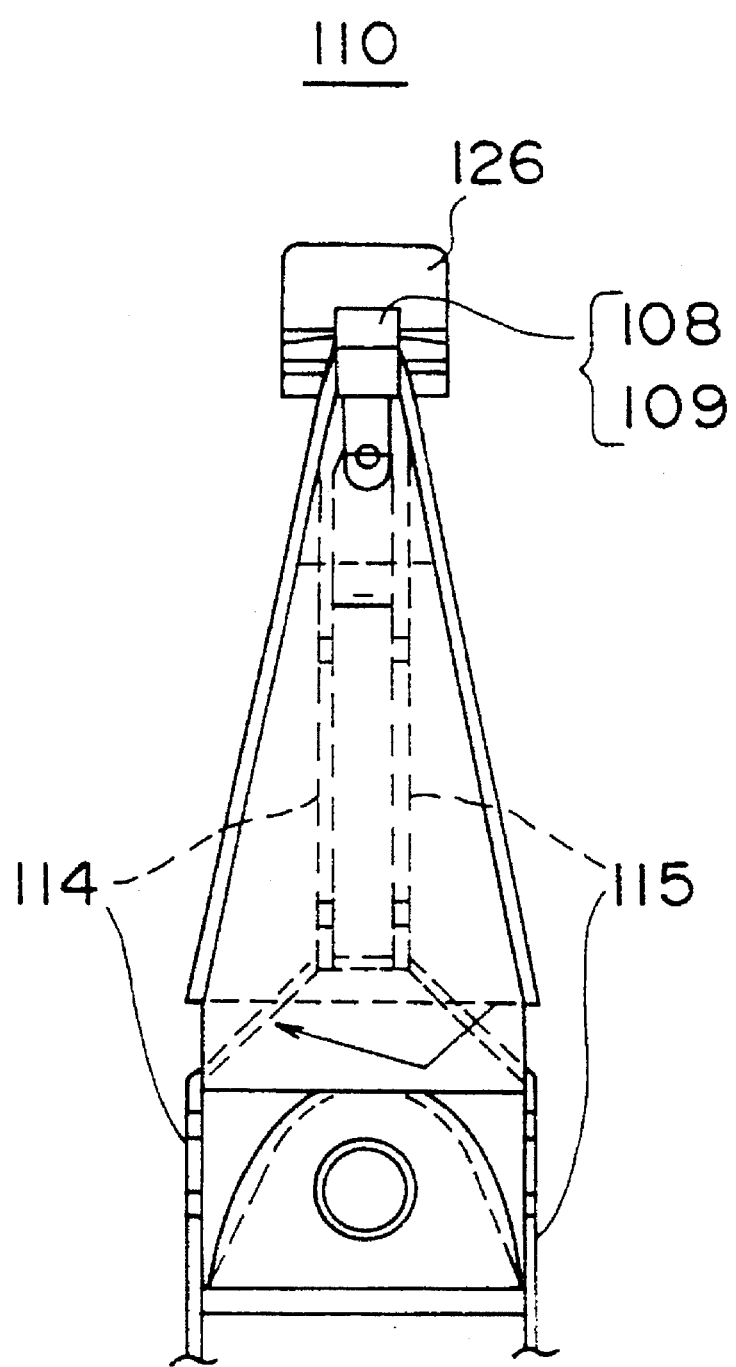
FIG. 7 is an enlarged diagram illustrating a spring arm provided in the actuator.

Referring to FIGS. 5 and 6, the head arm assemblies 104 are formed of arm bases 112 projecting from an actuator body 111 and spring arms 110 connected to the arm bases 112. Two spring arms are connected to each of the arm bases 112. The read/write heads 108 are mounted at leading ends of the spring arms 110. The servo head 109 is mounted at a leading end of a spring arm connected to a arm base 112a positioned at a middle portion of all the arm bases 112. The read/write heads 108 and the servo head 109 mounted on the head arm assemblies 104 face to surfaces of the magnetic heads 101. The surface facing the servo head 109 is referred to as a servo surface. The VCM 105 is coupled to a side surface of the actuator body 111 opposite to the arm bases 112. The VCM 105 is formed of a VCM magnet, an upper yoke, a lower yoke and the like. When an electric current is supplied to the VCM magnet, the actuator body 111 is pivoted on the shaft 106 in directions shown by arrows in FIG. 4. The electric current to be supplied to the VCM magnet is controlled based on the servo information supplied from the servo head 109, so that the read/write heads 109 are positioned on predetermined tracks of the magnetic disks 101. Lead wires 114 extend from each of the read/write heads 108 on a corresponding spring arm as shown in FIG. 7 and further extend along a side edge of a corresponding arm base 112 as shown in FIG. 6. Lead wires 115 extend from the servo head 109 so as to be approximately parallel to the lead wires 114 as shown in FIG. 7 and further extend along a side edge of the arm base 112a. The lead wires 114 are provided on one side of an imaginary plane 125 while the lead wires 115 are on the opposite side of the imaginary plane 125, the imaginary plane 125 passing through the shaft 106 of the actuator body 111 and the magnetic heads (the read/write heads 108 and the servo head 109) and being perpendicular to the surface of each of the arm assemblies 104. The lead wires 114 extending from the read/write heads 108 are soldered on R/W pads 116 formed on the FPC board 113. The lead wires 115 extending from the servo head 109 are soldered on servo pads 117 formed on the FPC board 113.

Figure 9:
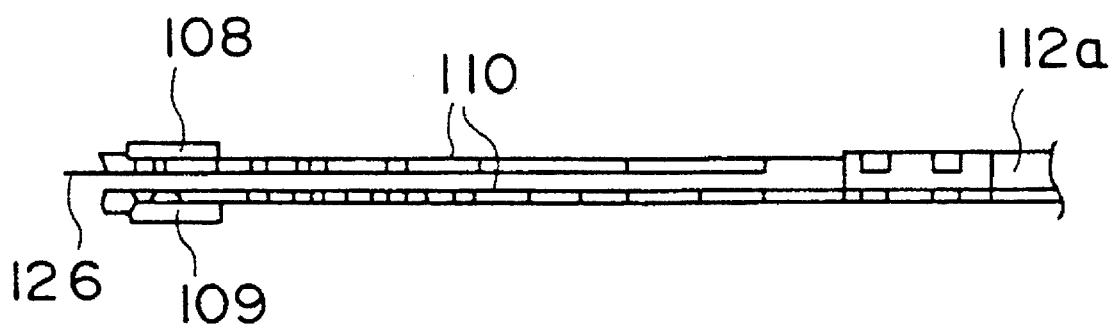
FIG. 9 is a side view illustrating the spring arm.
Figure 10:
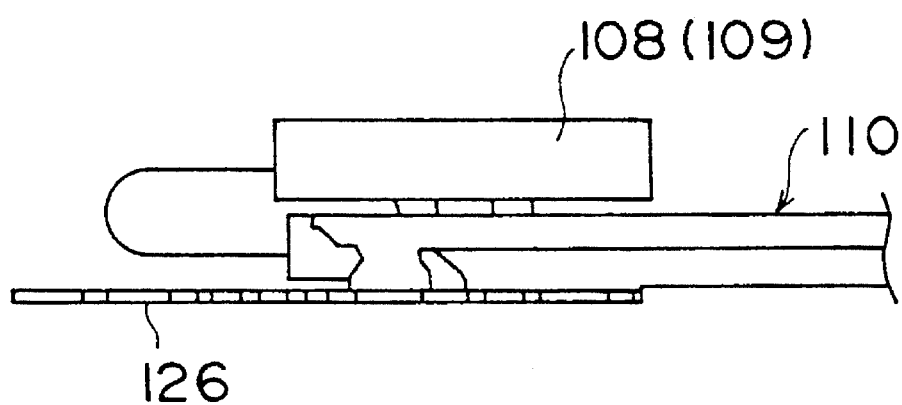
FIG. 10 is an enlarged diagram illustrating a structure of a leading end position of the spring arm.

The arm base 112a positioned at the middle portion of all the arm bases 112 is provided with two spring arms 110; the read/write head 108 is provided on the first spring arm and the servo head 109 is provided on the second spring arm. The first and second spring arms are parallel to each other as shown in FIG. 9. A magnetic plate 126 is fixed on the rear surface of the spring arm 110, on which the read/write head 108 is mounted, so as to be positioned between the read/write head 108 and the servo head 109 as shown in FIG. 9 and FIG. 10. The magnetic plate 126 prevents magnetic fields formed by the read/write head 108 and the servo head 109 from affecting each other.

Figure 11:
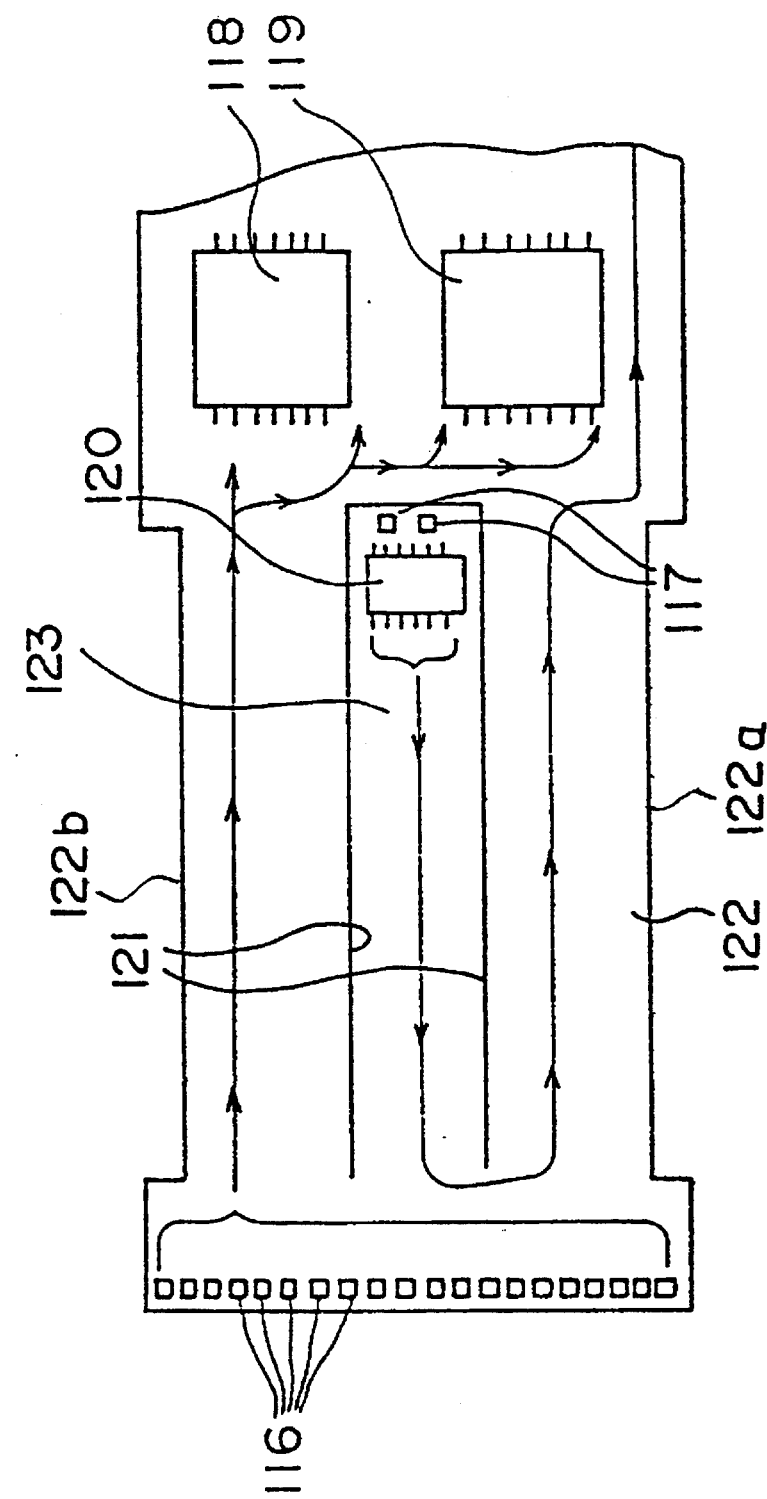
FIG. 11 is a diagram illustrating a flexible printed circuit board used for a circuit arrangement in the magnetic disk unit.
Figure 12:
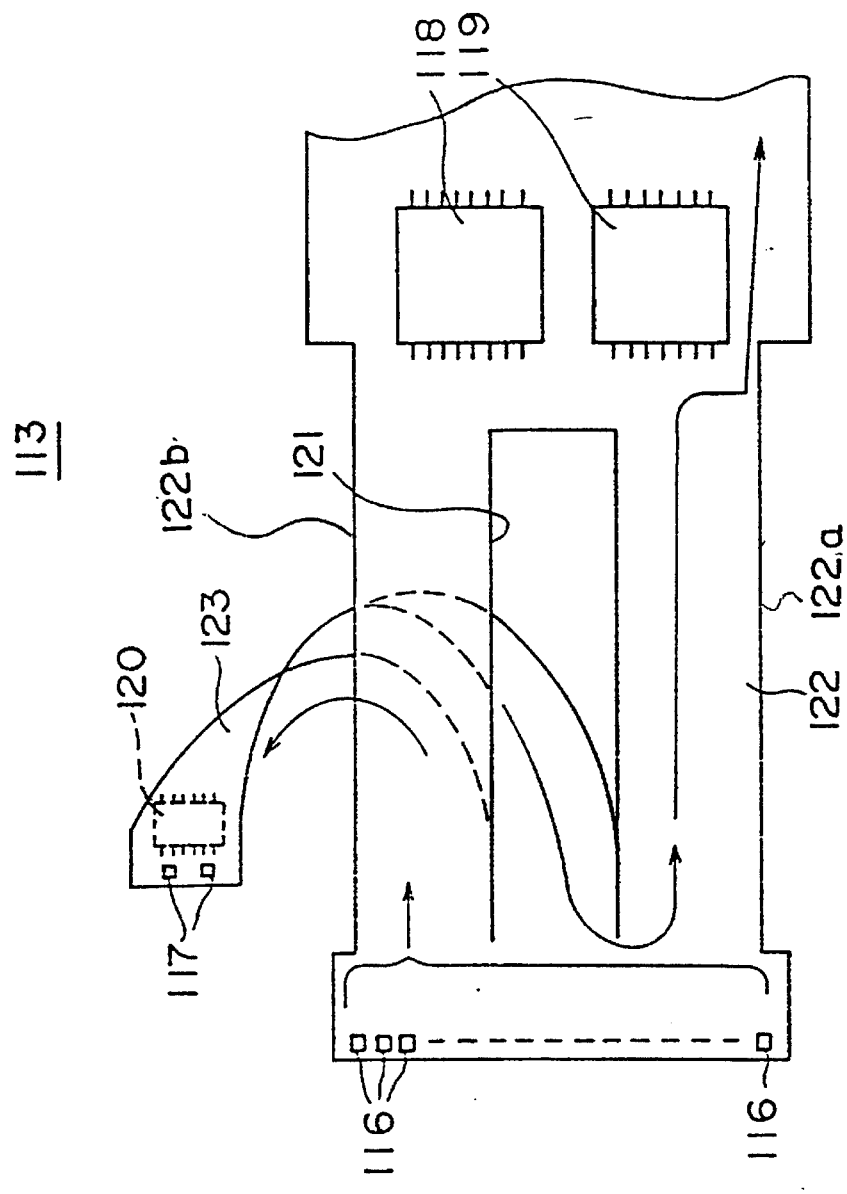
FIG. 12 is a diagram illustrating a structure of the flexible printed circuit board shown in FIG. 11.
Figure 13A:
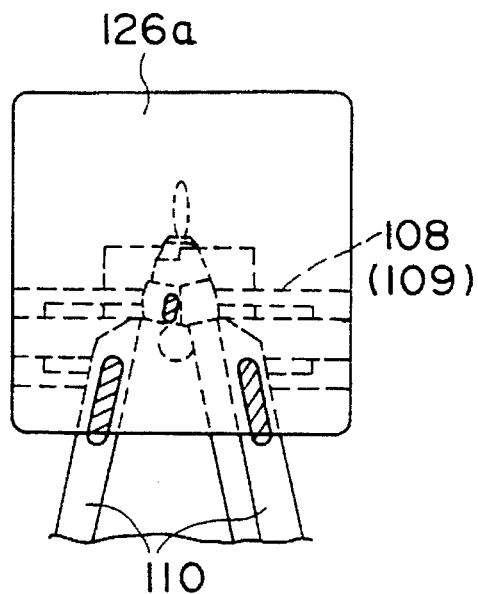
FIG. 13A, 13B, 13C and 13D are diagrams illustrating examples of a magnetic material plate provided between a servo head and a read/write head.
Figure 13B:
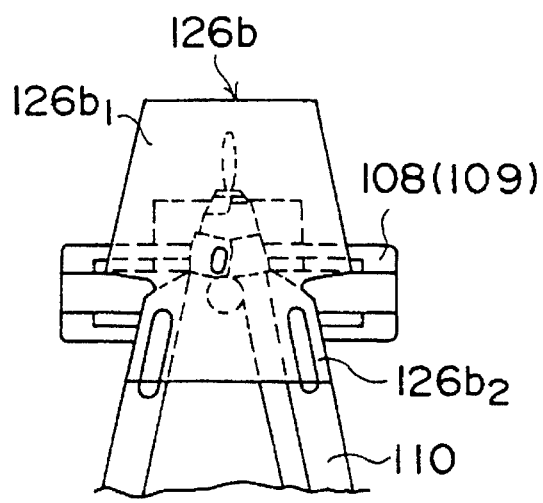
Figure 13C:
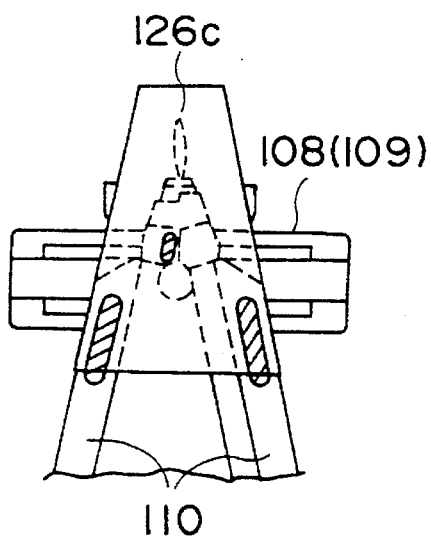
Figure 13D:
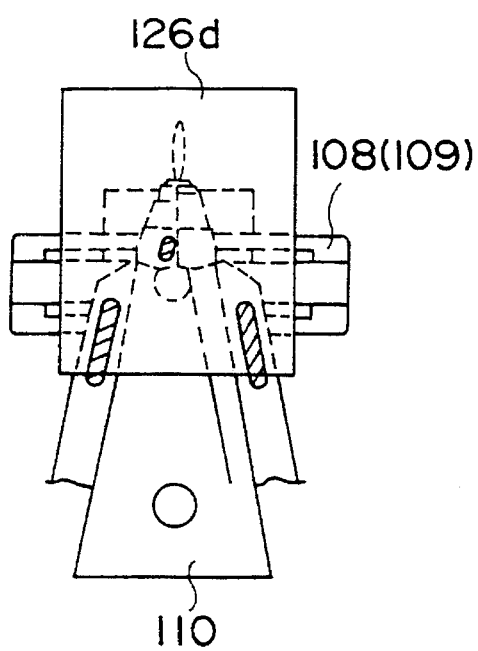

The FPC board 113 is formed as shown in FIG. 11 and 12. Referring to FIG. 11, the FPC board 113 has no large projection parts and is approximately rectangular. Semiconductor devices 118 and 119 for driving the read/write heads 108 are mounted at predetermined positions on the FPC board 113. The semiconductor devices 118 and 119 are referred to as read/write ICs 118 and 119. A semiconductor device 120 for driving the servo head 109 is mounted at a predetermined position on the FPC board 113. The semiconductor device 120 is referred to as a servo IC 120. A C-shaped cutting line 121 is formed such that the FPC 113 is divided into a first flexible board 122 having outer edges 122a and 122b and a second flexible board 123 by the C-shaped cutting line 121. The second flexible board 123 is positioned at the middle of the FPC 113 in a width direction thereof so as to correspond to the servo head 109 coupled to the arm base 112a which is positioned at the middle of the arm bases 112. The second flexible board 123 may be projected from the first flexible board 122 so as to be bendable, as shown in FIG. 12. The read/write ICs 118 and 119 are mounted on an IC land of the first flexible board 122 and the R/W pads 116 are formed at an end portion of the first flexible board 122. Printed patterns are formed between the R/W pads 116 and the IC land on which the read/write ICs 118 and 119 are mounted. An IC land on which the servo IC 120 is to be mounted is formed at an end portion of the second flexible board 123. The servo pads 117 are formed close to the IC land for the servo IC 120. The servo pads 117 are connected to the servo IC 120 mounted on the IC land, and printed patterns extend from the IC land for the servo IC 120 to the first flexible board 122 through a boundary between the first and second flexible boards 122 and 123 and further extend toward another end of the first flexible board 122.

The FPC board 113 is fixed on the actuator 103 and the bracket 127 as shown in FIGS. 4, 5, 6 and 8. The end portion of the first flexible board 122 on which the R/W pads 116 are formed is fixed on a side surface of the actuator body 111, the side surface being connected to the side edges of the arm bases 112 along which the lead wires 114 of the read/write heads 108 extend. The lead wires 114 of the read/write heads 108 are connected to the R/W pads as shown in FIG. 5. The first flexible board 122 extends to the bracket 127 so as to be bent as shown in FIG. 4 and the IC land for the read/write ICs 118 and 119 is fixed on the bracket 127. The first flexible board 122 further extends from the bracket 127 in a predetermined direction, so that the other end of the first flexible board 122 is fixed on a predetermined member.

Figure 8:
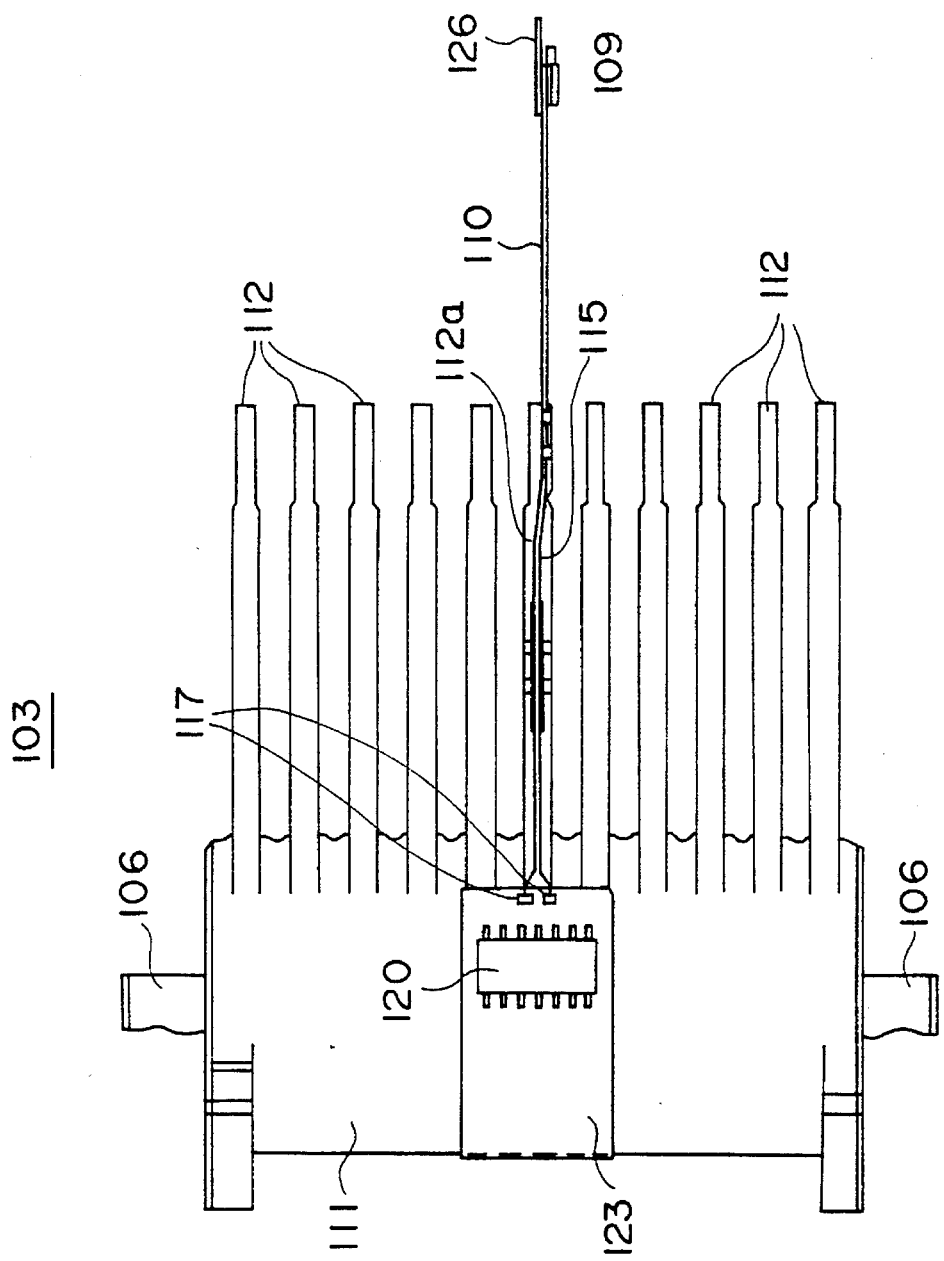
FIG. 8 is a side view illustrating a position at which a servo IC is mounted.

The second flexible board 123 extends on the surface of the actuator body 111 to the opposite side thereof as shown in FIG. 5, and the IC land for the servo IC 120 is positioned on the opposite side surface of the actuator body 111, the opposite side surface being connected to the side edges of the arm bases 112 along which the lead wires 115 of the servo head 109, as shown in FIG. 8. The lead wires 115 of the servo head 109 are connected to the servo pads 117 for the servo IC 120.

In the above first embodiment, the lead wires 114 of the read/write heads 108, the R/W pads, the first flexible board 122 and the read/write ICs 118 and 119 are on the left side of the imaginary plane 125 passing through the shaft 106 of the actuator body 111 and the magnetic heads (the read/write heads 108 and the servo head 109), while the lead wires 115, the servo pads 117 and the servo IC 120 are on the right of the imaginary line 125. That is, the circuit between the magnetic heads and the ICs is formed such that the lead wires 114 and 115 of the read/write heads 108 and the servo head 109 are provided far from each other and the read/write ICs 118 and 119 and the servo IC 120 are also provided far from each other. Thus, the electric currents flowing through the lead wires 114 of the read/write heads 108 have little electromagnetical effect on the current flowing through the lead wires 115 of the servo head 109. In addition, the FPC 113 is divided into the first flexible board 122 and the second flexible board 123 by the C-shaped cutting line 121 so that the second flexible board 123 may be projected from the first flexible board 122 so as to be bendable. The second flexible board 123 is mounted on the actuator body 111 so as to be along the surface thereof. Thus, it is not difficult to mount the second flexible board 123 on the actuator 103. Further, as the second flexible board 123 is not projected in the width direction of the FPC board 113, a plurality of FPC boards being the same as the FPC board 113 can be effectively cut out from the sheet-shaped material.

FIGS. 13A through 13D show examples of the shape of the magnetic plate 126 to be provided between the read/write head 108 and the servo head 109.

The magnetic plate 126 is made, for example, of iron. In a first example shown in FIG. 13A, the magnetic plate 126a is square shaped. In a second example shown in FIG. 13B, the magnetic plate 126b is formed of a trapezoid-shaped portion 126b1 projected from the tip end of the spring arm 110 and a mounting portion 126b2 mounted on the spring arm 110. In a third example shown in FIG. 13C, the magnetic plate 126c is trapezoid shaped. In a fourth example shown in FIG. 13D, the magnetic plate 126d is rectangular shaped.

The variously shaped magnetic plates 126 as shown in FIGS. 13A through 13D can prevent magnetic fields generated, close to the tip end of the spring arm 110, by the electric currents flowing through the lead wires 114 and 115 from affecting each other.

A description will now be given, with reference to FIGS. 14 through 24, of a second embodiment of the present invention.

Figure 14:
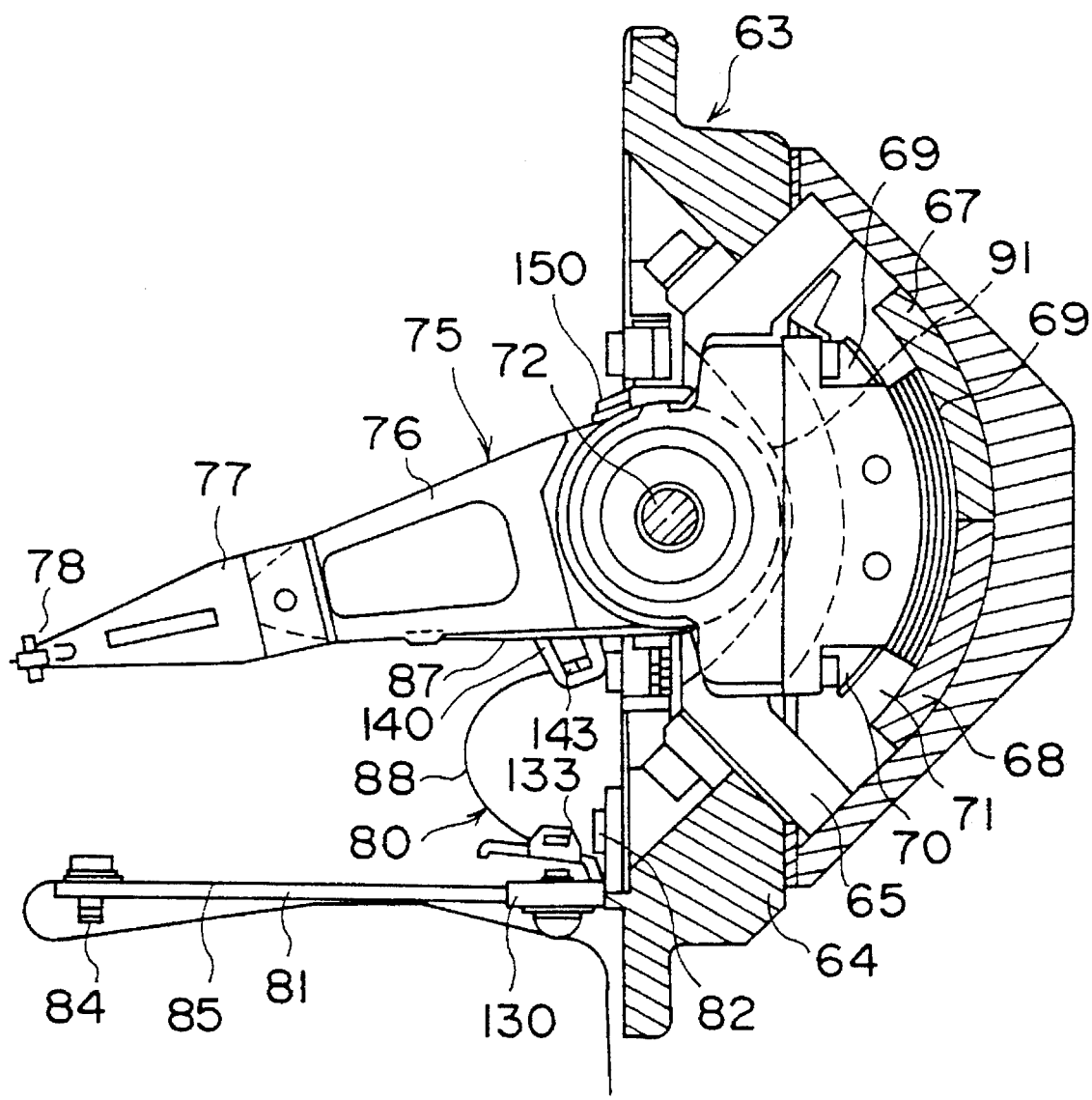
FIG. 14 is a plan view illustrating an actuator according to a second embodiment of the present invention.
Figure 15:
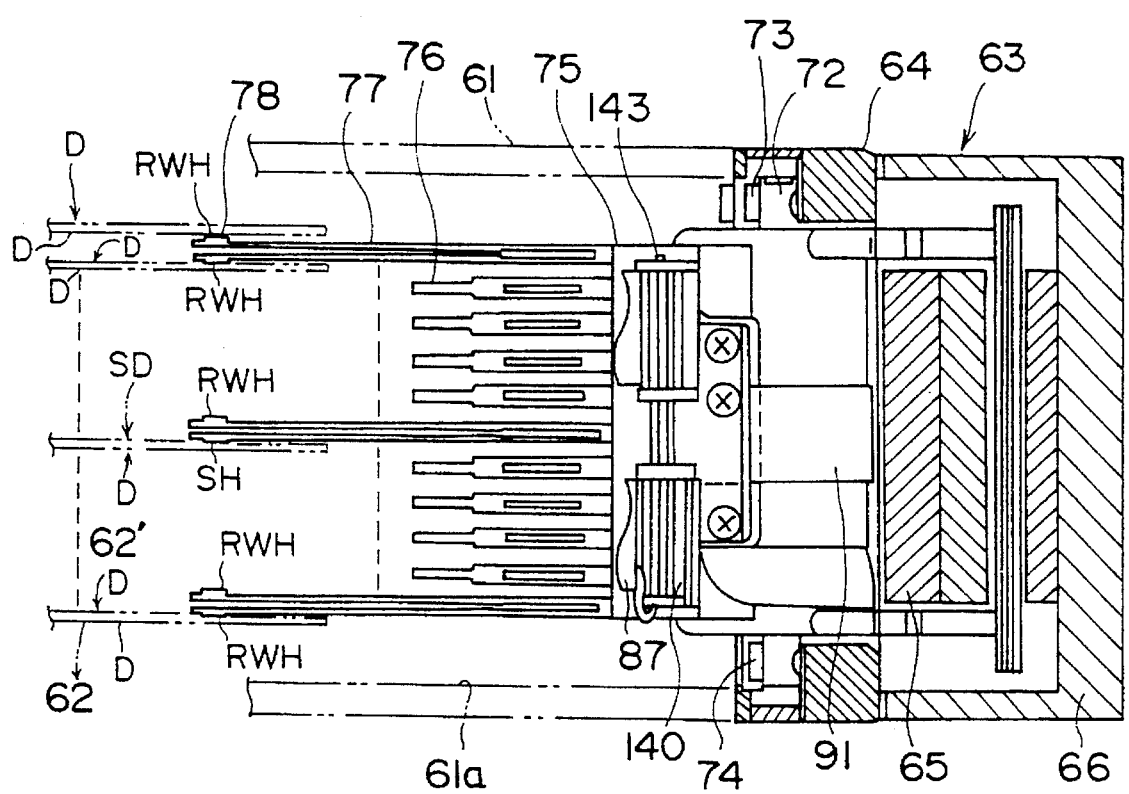
FIG. 15 is a partially sectional view illustrating the actuator according to the second embodiment of the present invention.

The actuator is formed as shown in FIG. 14 and 15. Referring to FIGS. 14 and 15, magnetic disks 62 are provided in an enclosure 61. The magnetic disks 62 are rotatably supported by a spindle motor (not shown) mounted on a base plate 61a so as to be rotated at a high speed (e.g. 3600 rpm). A magnetic circuit 63 is mounted at one of four corners of the enclosure 61. The magnetic circuit 63 has a mounting portion 64 mounted on the enclosure 61, an inner yoke 65 close to the mounting portion 64 and an outer yoke 66 close to the inner yoke 65. Magnets 67 and 68 are mounted on a surface of the outer yoke 66 facing the inner yoke 65, and magnets 69 and 70 are mounted on a surface of the inner yoke 65 facing the outer yoke 66. A magnetic gap 71 is formed between the inner yoke 65 and the outer yoke 66. An actuator body 75 is rotatably supported by an actuator shaft 72. A first end and a second end of the actuator shaft 72 are fixed on the mounting portion 64 by screws 73 and 74. The actuator body 75 is provided with a plurality of head arms 76 so as to extend from a surface thereof toward the magnetic disks 62. The respective head arms 76 are connected to spring arms 77 on which magnetic heads 78 are mounted at ends thereof. The magnetic heads 78 include a servo head for reading out servo information from a surface (referred to as a servo surface) of a predetermined magnetic disk 62' among the plurality of magnetic disks 62 and a plurality of read/write heads for reading out and writing data from and in surfaces (referred to as data surfaces) of the magnetic disks 62. The magnetic disk 62' having the servo surface is positioned at approximately the middle of all the magnetic disks 62 in the same manner as that in the conventional case.

A coil 69 is mounted on the surface of the actuator body 75 so as to be opposite to the head arms 76. The coil 69 is positioned in the magnetic gap 71. When an electric current is supplied from a controller (not shown) to the coil 69, a driving force is generated by an interaction between a magnetic field generated by the coil 69 and a magnetic field in the magnetic gap 71. The actuator body 75 is pivoted on the actuator shaft 72 by the driving force. The amount of pivoting of the actuator body 75 is controlled in accordance with the servo information read out from the servo head, so that the respective magnetic heads 78 are positioned on required tracks of the magnetic disks 62.

A plate 81 is fixed on the mounting portion of the magnetic circuit 63, the plate 81 extending toward the magnetic heads 78. The FPC board 80 is mounted on the plate 81 as will be described later.

Figure 16A:
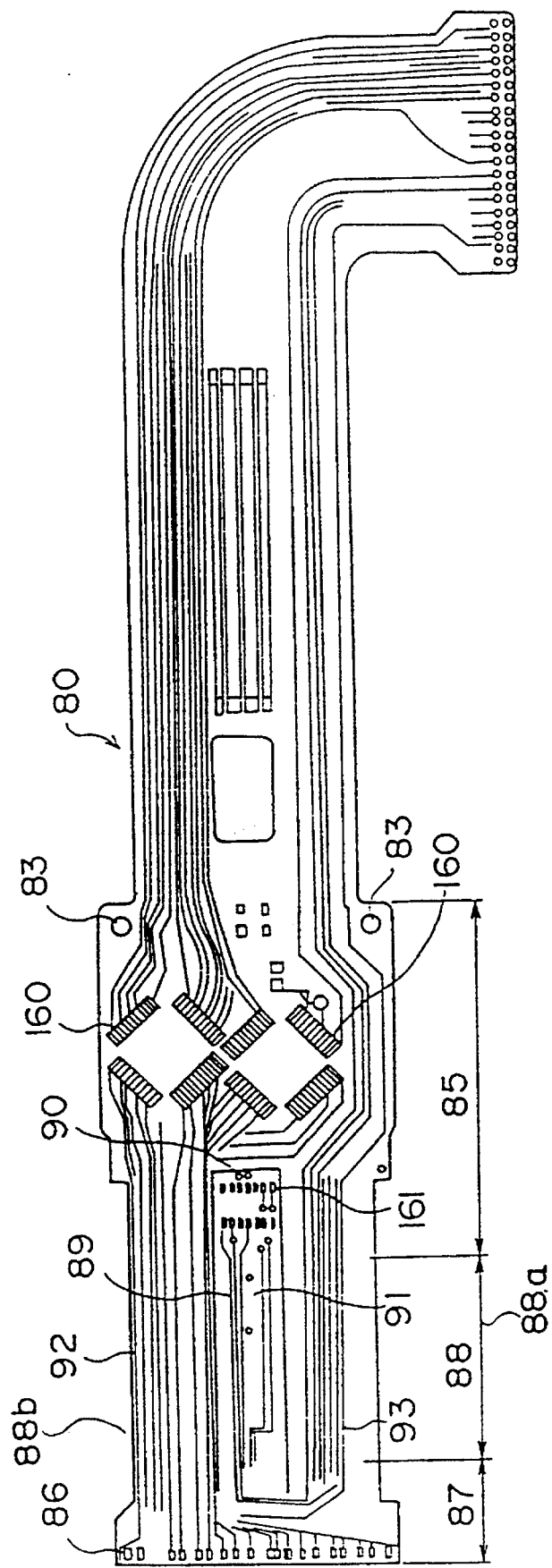
FIG. 16A is a diagram illustrating a flexible printed circuit board used for a circuit arrangement in the magnetic disk unit.
Figure 16B:
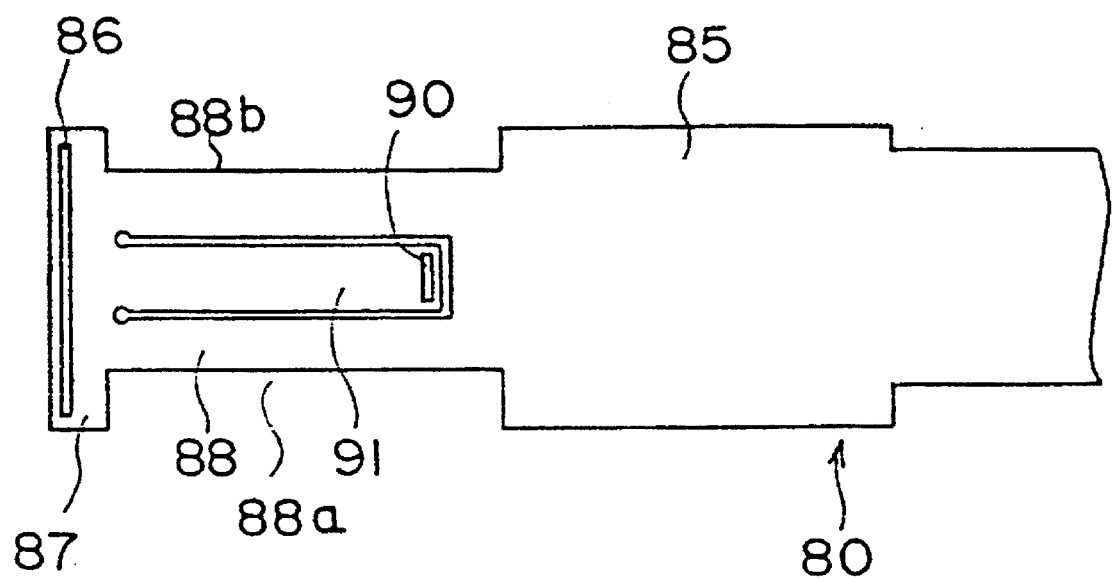
FIG. 16B is a diagram illustrating a simplified structure of the flexible printed circuit board.

The FPC board 80 is formed as shown in FIGS. 16A and 16B. Referring to FIG.16A, the FPC board 80 extends sideways in the long direction, and has a fixing portion 85 on which holes 83 are formed, a movable portion 87 positioned at an end of the FPC board 80 and a bendable portion 88 having outer edges 88a and 88b positioned between the fixing portion 85 and the movable portion 87. The fixing portion 85 having two layers is a portion to be fixed on the plate 81 by screws 84 passing through the holes 83. A read/write land 86 to be connected to the lead wires of the read/write heads is formed at an end of the movable portion 87. The movable portion 87 having two layers is a portion to be mounted at a side surface of the actuator body 75. The bendable portion 88 having a single layer is a portion to be bent in accordance with the rotation of the actuator body 75 in a space between the actuator body 75 and the plate 81.

The bendable portion 88 is divided into a first part and a second part by a C-shaped cutting line. The second part is referred to as a cutting-out portion 91. A first end of the cutting-out portion 91 is connected to a boundary area between the movable portion 87 and the bendable portion 88. A second end of the cutting-out portion 91 is separated from a boundary area between the fixing portion 85 and the bendable portion 88, and both side edges of the cutting-out portion 91 are separated from the first part of the bendable portion 88. That is, the cutting-portion 91 is formed on the bendable portion 88 as simply shown in FIG. 16B. The cutting-out portion 91 may be projected from the first part of the bendable portion 88 in the same manner as the second flexible board 123 as shown in FIGS. 11 and 12.

IC lands 160 on which read/write ICs are to be mounted is formed on the fixing portion 85. Read/write signal printed lines 92 are formed between the read/write land 86 and the IC lands 160 for the read/write ICs on the FPC board 80. Printed lines further extend from the IC lands 160 to the other end of the FPC board 80. A servo head land 90 to be connected to the lead wires of the servo head is formed at an end of the cutting-out portion 91. An IC land 161 on which a servo IC is to be mounted is formed at the end portion of the cutting-out portion 91, the IC land 161 being connected to the servo head land 90. Servo signal printed lines 89 connected to the IC land 161 for the servo IC are formed on the cutting-out portion 91. Other servo signal printed lines 93 are formed on the FPC board 80 so as to extend to the other end of the FPC board 80. The servo signal printed lines 89 and 93 are connected to each other through the boundary area between the movable portion 87 and the bendable portion 88.

Figure 17:
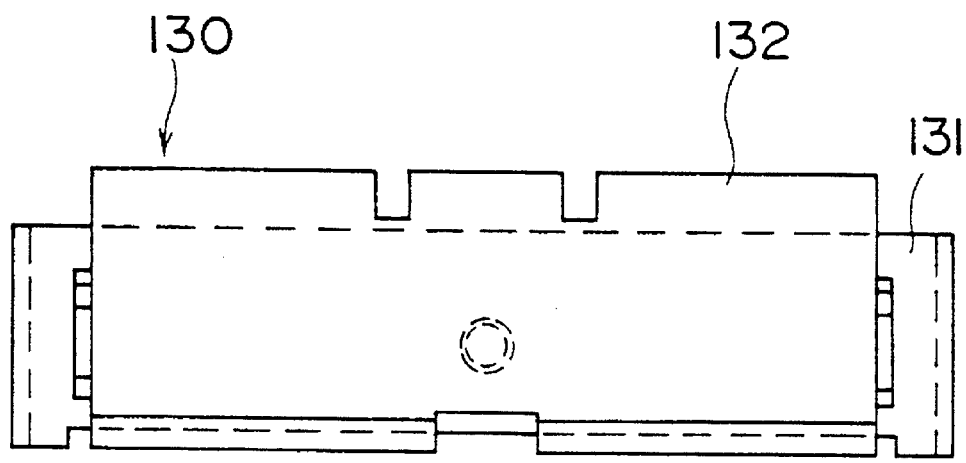
FIG. 17 is a plan view illustrating a first bracket on which the flexible printed circuit board is to be mounted.
Figure 18:
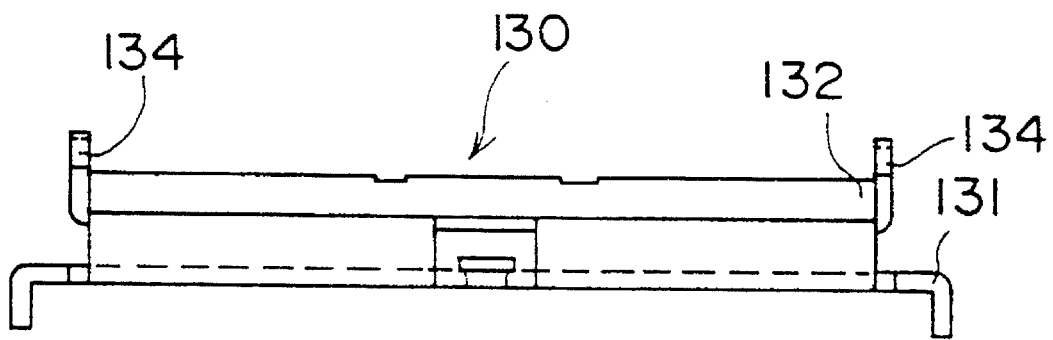
FIG. 18 is a front view illustrating the first bracket.
Figure 19:
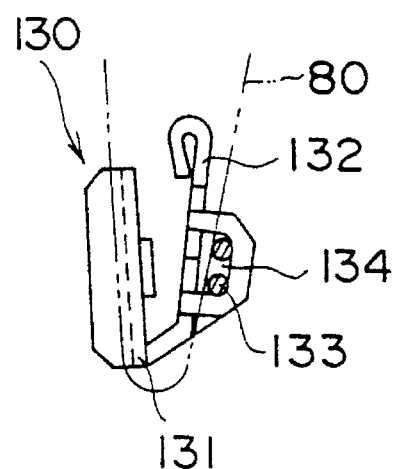
FIG. 19 is a left side view illustrating the first bracket.
Figure 20:
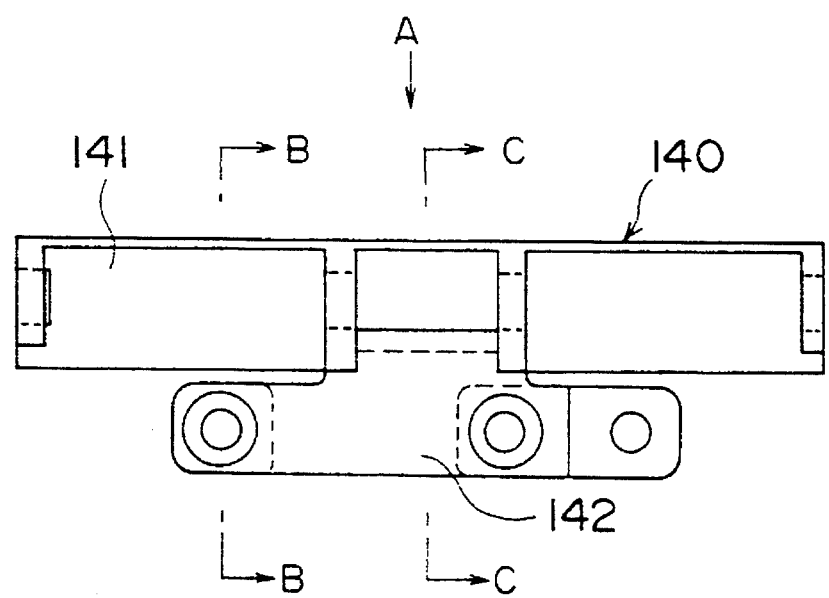
FIG. 20 is a plan view illustrating a second bracket on which the flexible printed circuit board is to be mounted.
Figure 21:
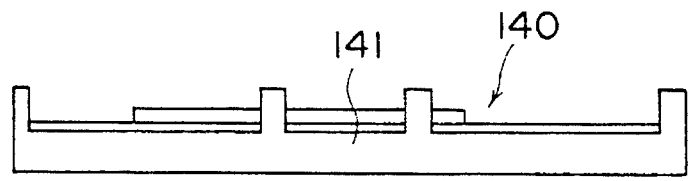
FIG. 21 is a view taken in the direction of the arrow of FIG. 20.
Figure 22:
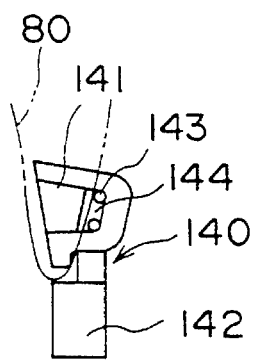
FIG. 22 is a left side view illustrating the second bracket.
Figure 23:
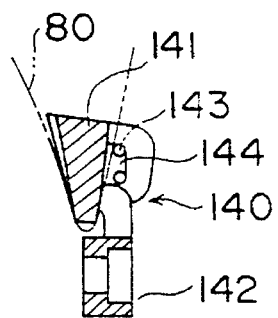
FIG. 23 is a cross sectional view taken along line B—B shown in FIG. 20.
Figure 24:
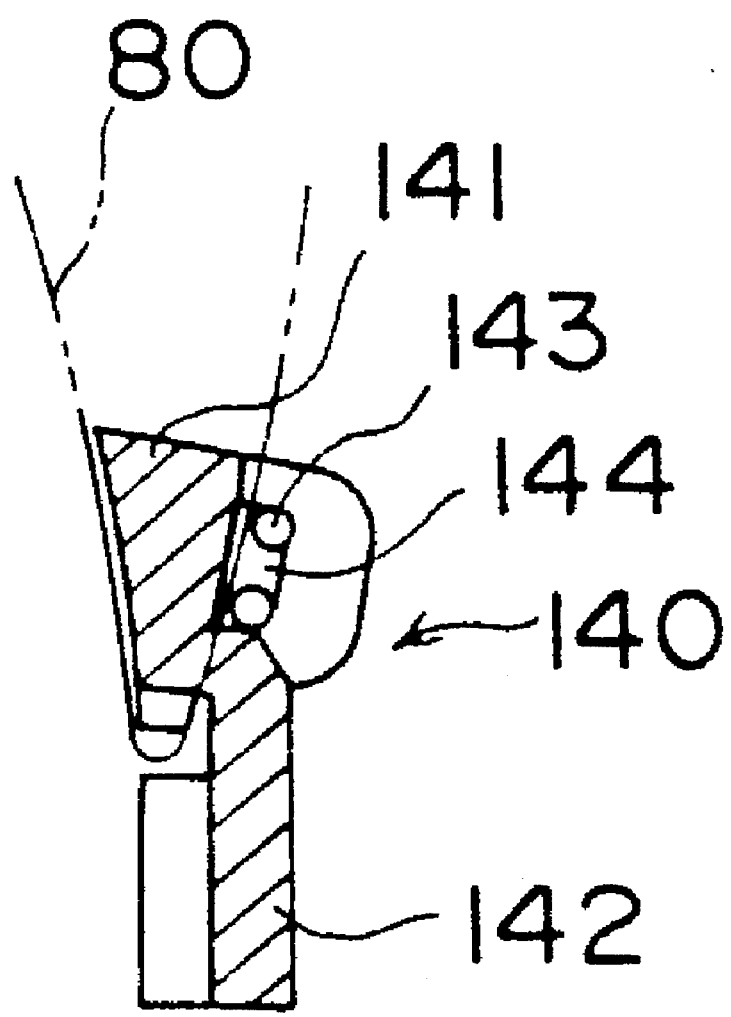
FIG. 24 is a cross sectional view taken along line C—C shown in FIG. 20.

The boundary area between the fixing portion 85 and the bendable portion 88 is mounted on the plate 81 using a first mounting member 130. The first mounting member 130 is fixed on the plate 81 by a screw 82. As shown in FIGS. 17, 18 and 19, the first mounting member 130 includes a base 131 and a supporting portion 132 for supporting a turning-up portion of the FPC board 80. The FPC board 80 is sandwiched by the plate 81 and the base 131 of the first mounting member 130. Holes 134 through which a pin 133 for supporting the turning-up portion of the FPC board 80 is to be inserted are formed at the ends of the supporting portion 132.

The boundary area between the bendable portion 88 and the movable portion 87 is mounted on the side surface of the actuator body 75 using a second mounting member 140. As shown in FIGS. 20, 21, 22, 23 and 24, the second mounting member 140 includes a base 141 and a fixing block 142. The first part of the bendable portion 88 of the FPC board 80 is sandwiched by the base 141 of the second mounting member 140 and the actuator body 75, the first part being a part of the bendable portion 88 other than the cutting-out portion 91. The base 141 having a wedge shaped cross section supports a turning-up portion of the first part of the bending portion 88. The fixing block 142 fixes the cutting-out portion 91 which is not turned up on the side surface of the actuator body 75. A hole 144 through which a pin 143 for supporting the cutting-out portion 91 is inserted is formed on the base 141. The cutting portion 91 of the bendable portion 88 extends to the opposite side surface of the actuator body 75 through the magnetic circuit 63 of the actuator and is mounted on the opposite side surface of the actuator body 75 by a third mounting member 150.

In FIG. 16A, the read/write head ICs which are QFP type are mounted on the IC lands 160. Each of the IC lands 160 has input and output pads arranged on four sides of a square. The two sides on which the input pads are arranged are inclined by 45° with respect to a direction in which the FPC board 80 extends. The side lines on which the output pads are arranged are also inclined by 45° with respect to the direction in which the FPC board 80 extends.

According to the above second embodiment, the read/write head land 86 of the FPC board 80 is mounted on the side surface of the actuator body 75 and the servo head land 90 of the FPC board 80 is mounted on the opposite side surface of the actuator body 75. Further, the read/write signal printed lines 92 and the servo printed lines 98 and 93 do not cross each other on the FPC board 80. Thus, the electric currents flowing in the read/write head and the servo head do not affect each other. In addition, as the cutting-out portion 91 is formed in the bending portion 88, a plurality FPC board having the same shape as the FPC 80 described above can be effectively cut out from a sheet-shaped material. Thus, the production cost of the FPC 80 can be decreased.

Furthermore, two lines on which the input pads of each of the IC lands 160 are arranged are inclined by 45° with respect to a direction in which the FPC board 80 extends, and two lines on which the output pads of each of the IC lands 160 are arranged are also inclined by 45° with respect to the direction in which the FPC board 80 extends. Thus, the width of the FPC 80 in a direction perpendicular to the direction in which the FPC 80 extends can be decreased. As a result, the production cost of the FPC 80 can be decreased.

The present invention is not limited to the aforementioned embodiments, and variations and modifications may be made without departing from the scope of the claimed invention.

What is claimed is:

1. A magnetic disk device comprising:

a plurality of magnetic disks;

a plurality of read/write heads for reading out information from and writing information on said plurality of magnetic disks;

a servo head for reading out servo information from a surface of a predetermined magnetic disk among said plurality of magnetic disks;

an actuator for moving said plurality of read/write heads and said servo head under a condition in which said plurality of read/write heads and said servo head face surfaces of said plurality of magnetic disk, said actuator having an actuator body rotatably supported by a shaft and an arm structure extending from said actuator body toward said plurality of magnetic disks, said plurality of read/write heads and said servo head being mounted at a tip end of said arm structure;

a flexible printed circuit board having a first portion and a second portion, said first portion having generally parallel outer edges between which are provided a first circuit element for said plurality of read/write heads and first printed patterns connected to said first circuit element, wherein in an unflexed state said second portion is positioned entirely within said first portion between said outer edges, an end of said second portion being connected to said first portion so as to be bendably projected from said first portion, said second portion being provided with a second circuit element for said servo head and with second printed patterns connected to said second circuit element, said flexible printed circuit board being mounted on said actuator body such that one end of said first portion lies outside said actuator and said second portion lies on said actuator body;

first lead wires of said read/write heads extending to said flexible printed circuit board and being connected to said first patterns; and second lead wires of said servo head extending to said flexible printed circuit board and being connected to said second printed patterns, wherein said first lead wires and said first circuit element for said plurality of read/write heads are on one side of an imaginary plane while said second wires and said second circuit element for said servo head are on an opposite side of said imaginary plane, said imaginary plane passing through the tip end of said arm structure and said shaft of said actuator body and being parallel to said shaft.

2. The device as claimed in claim 1, wherein said flexible printed circuit board is divided into said first portion and said second portion by a cutting line of predetermined shape.

3. The device as claimed in claim 1, wherein said second portion of said flexible printed circuit is positioned at approximately a middle portion of said flexible printed circuit in a width direction.

4. The device as claimed in claim 1, wherein said first lead wires extend along an edge of said arm structure and said second lead wires extend along an opposite edge of said arm structure.

5. The device as claimed in claim 1, wherein said servo head and a read/write head adjacent to said servo head among said plurality of read/write heads are magnetically shielded from each other.

6. The device as claimed in claim 5, wherein a magnetic plate is provided between said servo head and said read/write head.

7. The device as claimed in claim 1, wherein said first portion of said flexible printed circuit has an IC land on which said first circuit element is to be mounted, said IC land having a plurality of pads connected to printed lines in said first printed patterns, and wherein said plurality of pads are arranged in lines inclined with respect to a direction in which the printed lines extend.

8. The device as claimed in claim 7, wherein the lines in which said plurality of pads are arranged are inclined by approximately 45° with respect to the direction in which the printed lines extend.

9. The device as claimed in claim 1, wherein:

said second portion and said first portion have generally parallel longitudinal axes.

10. The device as claimed in claim 1, wherein:

said first printed circuit patterns are generally parallel to said second printed circuit patterns.

11. The device as claimed in claim 1, wherein:

said second portion bendably projects around said shaft.

12. A magnetic disk device comprising:

a plurality of magnetic disks;

a plurality of read/write heads for reading out information from and writing information on said plurality of magnetic disks;

a servo head for reading out servo information from a surface of a predetermined magnetic disk among said plurality of magnetic disks;

an actuator for moving said plurality of read/write heads and said servo head under a condition in which said plurality of read/write heads and said servo head face surfaces of said plurality of magnetic disk, said actuator having an actuator body rotatably supported by a shaft and an arm structure extending from said actuator body toward said plurality of magnetic disks, said plurality of read/write heads and said servo head being mounted at a tip end of said arm structure;

a flexible printed circuit board having a first portion and a second portion, said first portion having generally parallel outer edges between which are provided a first circuit element for said plurality of read/write heads and first printed patterns connected to said first circuit element, wherein in an unflexed state said second portion is positioned entirely within said first portion between said outer edges, an end of said second portion being connected to said first portion so as to be bendably projected from said first portion, said second portion being provided with a second circuit element for said servo head and with second printed patterns connected to said second circuit element, said flexible printed circuit board being mounted on said actuator body such that one end of said first portion lies outside said actuator and said second portion is bendably mounted around said shaft;

first lead wires of said read/write heads extending to said flexible printed circuit board and being connected to said first patterns; and second lead wires of said servo head extending to said flexible printed circuit board and being connected to said second printed patterns, wherein said first lead wires and said first circuit element for said plurality of read/write heads are on one side of an imaginary plane while said second wires and said second circuit element for said servo head are on an opposite side of said imaginary plane, said imaginary plane passing through the tip end of said arm structure and said shaft of said actuator body and being parallel to said shaft.

13. A flexible printed circuit board applicable to a magnetic disk device having a plurality of magnetic disks, a plurality of read/write heads for reading out information from and writing information on said plurality of magnetic disks, and a servo head for reading out servo information from a surface of a predetermined magnetic disk among said plurality of magnetic disks, said flexible printed circuit board comprising:

a first portion having generally parallel outer edges between which are provided a first circuit element for said plurality of read/write heads and first printed patterns connected to said first circuit element; and a second portion positioned entirely within said first portion between said outer edges when in an unflexed state, an end of said second portion is connected to said first portion so as to be bendably projected from said first portion, said second portion being provided with a second circuit element for said servo head and with second printed patterns connected to said second circuit element, wherein first lead wires of said read/write heads may be connected to said first patterns, second lead wires of said servo head may be connected to said second printed patterns and said first and second lead wires are sufficiently separated to prevent electromagnetic interference from adversely affecting said reading out of servo information.

14. The flexible printed circuit board as claimed in claim 9, wherein said flexible printed circuit board is divided into said first portion and said second portion by a cutting line of a predetermined shape.

15. The flexible printed circuit board as claimed in claim 13, wherein said second portion is positioned at approximately a middle portion of said flexible printed circuit in a width direction.

16. The flexible printed circuit board as claimed in claim 13, wherein said first portion has an IC land on which said first circuit element is to be mounted, said IC land having a plurality of pads connected to printed lines in said first printed patterns, and wherein said plurality of pads are arranged in lines inclined with respect to a direction in which the printed lines extend.

17. The flexible printed circuit board as claimed in claim 16, wherein the lines in which said plurality of pads are arranged are inclined by approximately 45° with respect to the direction in which the printed lines extend.

18. The device as claimed in claim 13, wherein:

said second portion and said first portion have generally parallel longitudinal axes.

19. The device as claimed in claim 13, wherein:

said first printed circuit patterns are generally parallel to said printed circuit patterns.

* * * * *

UNITED STATES PATENT AND TRADEMARK OFFICE
CERTIFICATE OF CORRECTION

PATENT NO. : 5,541,788
DATED : July 30, 1996
INVENTOR(S) : Ishida et al.

It is certified that error appears in the above-indentified patent and that said Letters Patent is hereby corrected as shown below:

Column 3, line 4, delete "an leading" and insert --a leading--

Column 3, line 42, after "servo head", delete "are"

Column 3, line 54, delete "lead/write" and insert --read/write--

Column 3, line 66, after "novel and useful", delete "in a"

Column 4, line 11, delete "object" and insert --objects--

UNITED STATES PATENT AND TRADEMARK OFFICE
CERTIFICATE OF CORRECTION

PATENT NO. : 5,541,788
DATED : July 30, 1996
INVENTOR(S) : Ishida et al.

It is certified that error appears in the above-indentified patent and that said Letters Patent is hereby corrected as shown below:

Column 11, line 39, after "magnetic", delete "disk" and insert --disks--

Column 12, line 58, delete "disk" and insert --disks-- (From

Column 14, line 16, delete "claim 9" and insert --claim 13--

Column 14, line 40, after "said" insert --second-- (From

Signed and Sealed this

Fifth Day of August, 1997

Attest:

Attesting Officer

BRUCE LEHMAN

Commissioner of Patents and Trademarks